United States Patent [19]
Damp

[11] Patent Number: 5,111,134

[45] Date of Patent: May 5, 1992

[54] METHOD AND APPARATUS FOR DETERMINING THE FREQUENCY OF SHORT OSCILLATION BURSTS OF ELECTRICAL SIGNALS

[75] Inventor: Stephan Damp, Weil am Rhein, Fed. Rep. of Germany

[73] Assignee: Deutsch-Franzosisches Forschungs-Institut, St. Louis, France

[21] Appl. No.: 440,523

[22] Filed: Nov. 22, 1989

[30] Foreign Application Priority Data

Nov. 28, 1988 [DE] Fed. Rep. of Germany ....... 3840109

[51] Int. Cl.[5] ..................... G01R 23/09; G01P 5/00; G01S 17/58
[52] U.S. Cl. .............................. 324/78 D; 324/79 D; 342/115; 377/19; 377/39; 377/50
[58] Field of Search ..................... 342/114, 115, 104; 324/78 R, 78 D, 79 R, 79 D; 377/19, 39, 50

[56] References Cited

U.S. PATENT DOCUMENTS

| | | |
|---|---|---|
| 3,321,759 | 5/1967 | Freedman . |
| 3,546,585 | 12/1970 | Leibowitz et al. . |
| 3,863,198 | 1/1975 | Lerner ................... 342/115 |
| 3,909,714 | 9/1975 | Nakano ............... 324/79 D |
| 4,005,364 | 1/1977 | Harrington ........ 324/79 D |
| 4,051,433 | 9/1977 | Dimotakis et al. . |
| 4,527,160 | 7/1985 | Endo .................. 342/115 |

OTHER PUBLICATIONS

Review of Scientific Instruments, Band 53, Nr. 5, Mai 1982, Seiten 656-661; J. C. Fanton et al.: "Versatile microprocessor data logging and processing system for laser Doppler anemometry".

J. Phys. E. Scient. Instrum., Band 10, Nr. 8, Aug. 1977, Seiten 811-813; I. TAI et al.,: "Digital frequency meter for burst-like laser Doppler signals".

Messen+Prufen, Nrs. 7/8, Jul./Aug. 1878, Seiten 436-438; H. J. Haag: "Transientenspeicher-ein Beitrag zu moderner Oszilloskopie".

Rev. Sci. Instrum., Band 47, Nr. 6, Jun. 1976, Seiten 708-711; H. T. Kalb et al.: "New technique in the processing and handling of laser velocimeter burst data".

International Journal of Electronics, Band 62, Nr. 1, Jan. 1987, Seiten 93-95; A. A. Khan et al.: "Simple attachment to analogue/digital multimeter for frequency measurement up to 10 MHz".

Primary Examiner—Kenneth A. Wieder
Assistant Examiner—Jose M. Solis
Attorney, Agent, or Firm—Armstrong, Nikaido, Marmelstein, Kubovcik & Murray

[57] ABSTRACT

In a method and an apparatus for determining the frequency of short oscillation bursts of electrical signals firstly oscillation bursts in desired number are read into a storage means and read out again cyclically adjoined to each other so that an oscillation train of any desired length results of which the mean frequency can be easily determined.

18 Claims, 5 Drawing Sheets

METHOD AND APPARATUS FOR DETERMINING THE FREQUENCY OF SHORT OSCILLATION BURSTS OF ELECTRICAL SIGNALS

BACKGROUND OF THE INVENTION

1. Field of the Invention

The invention relates to a method and apparatus for determining the frequency of short oscillation bursts of electrical signals.

Within the scope of the present invention a short oscillation burst of an electrical signal means a fragment limited in time of some 10 or less oscillations of a narrow-band AC signal. Such an oscillation bunch is referred to as burst.

2. Description of the Prior Art

Whereas the determination of the frequency of a longer, i.e. theoretically infinitely long, narrow-band AC signal lasting practically more than several hundred oscillations generally presents no problems, the determination of the frequency of an oscillation burst consisting only of a few oscillations proves to be complicated, particularly for higher frequencies.

Thus, a period duration measurement, i.e. measurement of the time between two similar signal points, generally the zero passages of the signal, is only useful when the time basis available is of substantially higher frequency than the signal burst frequency. To form an average value, as is necessary with slight phase jitter of the signal, an external circuit must be employed.

For frequency counting, i.e. for counting out the oscillations in a time window, a highspeed and thus complicated counter circuit is necessary. With additional expenditure, such a counter circuit can be provided with a means for (analog) measurement of the phase error between the time window and the counting threshold.

In addition, methods are known such as the Fourier transformation or correlation analysis which are both very informative and also noise tolerant, but they require a relatively high expenditure.

Furthermore, a frequency determination can be made by a phase-synchronous lock loop (PLL) which however requires a high oscillation burst recurrence frequency and the individual oscillation burst frequencies must not lie too far apart. However, this makes it possible to a limited extent to obtain an average value over several oscillation bursts without additional expenditure.

Such methods and apparatuses are used in countless areas of technology for frequency determination of oscillation or signal bursts. An important area of use is laser Doppler velocimetry (LDV). As a rule, for the signal evaluation here a personal computer is employed which performs parts of the evaluations described but is also intended to form a mean value and various other statistical quantities of successive signal burst frequencies.

SUMMARY OF THE INVENTION

The invention is thus based on the problem of further developing the hitherto known methods and apparatuses and making available a method and apparatus which operate in the simplest possible manner.

The invention therefore proposes a method for determining the frequency of short oscillation bursts of electrical signals wherein firstly a reading in of a desired number of the oscillation bursts into a storage means is carried out and thereafter a reading of the oscillation bursts out of the storage means in such a manner that the oscillation bursts directly follow each other in the order of the reading in for generating an oscillation burst sequence, and that a cyclically repeated reading out of the oscillation burst sequence takes place, the oscillation burst sequences being directly adjoined to each other until a previously predeterminable number of readout cycles is reached and finally a determination of the frequency of the adjoining oscillation burst sequences is performed.

The method according to the invention is therefore extremely simple. Any desired number of oscillation bursts, the maximum number being limited only by the capacity of the storage means, is first collected in the memory or storage means; after reaching the desired number of oscillation bursts the latter are made available again by cyclic reading out of the memory. The cyclic reading out leads to not only a (short) oscillation burst being available now for the further signal processing but due to the uninterrupted adjoining repeated reading out of the oscillation burst sequence a wave train of fundamentally any desired length. The mean frequency thereof may be easily determined.

According to an advantageous embodiment of the method according to the invention it is not even necessary for several oscillation bursts to be present but instead a single oscillation burst is read in and by cyclic reading out with direct adjoining of the individual oscillation bursts to each other an oscillation burst sequence is formed which can then be processed in the aforementioned manner.

To ensure that during the read-in time as well a cyclic signal is also available for further processing, advantageously alternately a number of oscillation bursts is read in and a number of oscillation burst sequences read out.

To simplify the further processing a further advantageous embodiment of the invention proposes digitizing each oscillation burst prior to the reading in to a serial bit sequence. Accordingly, the reading in preferably takes place serially; the reading out may however also be effected in serial manner.

The simplicity of the method according to the invention compared with the methods referred to at the beginning becomes particularly clear when the determination of the frequency of the adjoining oscillation burst sequences is carried out in analog manner. Said analog frequency determination is even possible with a simple low-pass filter.

The invention accordingly proposes an apparatus for determining the frequency of short oscillation bursts of electrical signals comprising a read-in means for one or more oscillation bursts which is followed by a storage means from which in response to a control means connected thereto the oscillation bursts can be read out in cyclic repetition in succession and supplied to a processing unit which is connected to the memory means for the frequency determination.

The main advantage of the apparatus according to the invention resides in that only a few components are necessary and furthermore they are not very complicated. The apparatus according to the invention can therefore easily be miniaturized and arranged, for instance for use as hand apparatus, altogether on a single so-called Europa card.

The advantages already explained in conjunction with the methods according to the invention apply accordingly to the apparatus according to the invention.

Thus, advantageously the read-in means is preceded by a converter means which converts the oscillation bursts each to serial digital oscillation bursts.

A particularly simple serial processing of the read-in operation results if between the read-in means and storage means a shift register is provided. This advantage can be obtained in still further simplification if also or alternatively a shift register is provided between storage means and processing unit. It is to be pointed out in particular that the component defining the processing frequency is only the shift register provided between read-in means and storage means, i.e. in the read-in section, the shift cycle of which defines the sampling frequency; all the other components need not satisfy any high demands as regards speed.

The processing unit for frequency determination may, as already mentioned, operate in analog manner, i.e. be an analog processing unit which can be implemented particularly simply as low-pass filter.

For checking the oscillation bursts for previously predefinable features prior to the reading-in the read-in means is preferably preceded by a further means serving for the checking; these features may for example be predefined externally and preferably also varied in accordance with the intended use.

To permit a simultaneous read-in and readout the storage means preferably comprises a first memory and a second memory which read in and out alternately.

BRIEF DESCRIPTION OF THE DRAWINGS

The invention will be explained hereinafter in detail with the aid of examples of embodiment illustrated in the drawings, from which further advantages and features will be apparent.

In the drawings.

DESCRIPTION OF THE PREFERRED EMBODIMENTS

Figure 1:
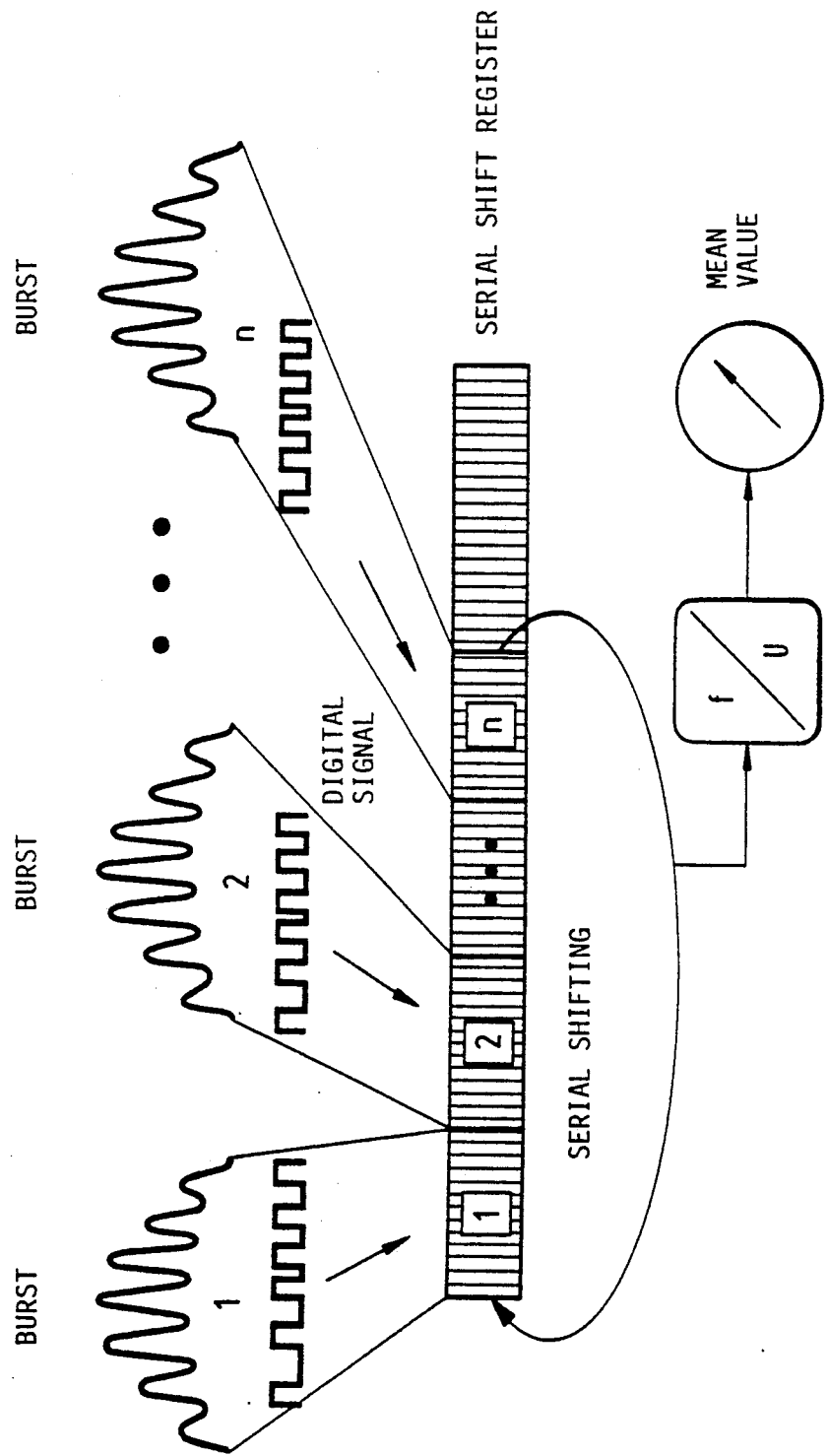
FIG. 1 shows the fundamental mode of operation of the present invention.

FIG. 1 illustrates the basic idea of the method according to the invention or apparatus according to the invention. Any desired number "n" of statistically successive oscillation groups or bunches (bursts) is digitized, only their AC component but not their changing offset being of interest. Said digitized signals are written consecutively, i.e. disregarding the pauses between the bursts, to a serial store. Said serial store may in practice be implemented for example as long shift register. When the n bursts have been stored the stored serial bit sequence is output again as present in the memory. This is done in that after reading out the last bit of the nth burst without interruption the process is continued with the first bit of the first burst of the readout operation. The unwritten ("empty") remainder of the store or memory is not taken into account.

This cyclic reading out of the contiguous bursts is carried out as long as desired and an "infinite" wave train is thus obtained from a number n of finite oscillation trains. This signal can be supplied to any desired circuit for determining the frequency. One particularly simple possibility for this purpose, indicated schematically in FIG. 1, is to employ a frequency-voltage conversion; the resulting voltage is proportional to the mean signal frequency and can be displayed directly.

Thus, in advantageous manner with comparatively little expenditure the mean value of the signal frequency of a burst sequence can be determined. This also has effects on the necessary sampling in the analog-digital conversion of the bursts. Whereas in the previous method the digitizing error in the sampling of a burst directly enters into the result of the frequency determination carried out before the averaging, with the method according to the invention the digitizing error averages itself out because the frequency determination takes place after the formation of the mean value.

The only requirement for this is the use of an adequately large number of bursts for the averaging, the burst sequence still not being correlated with the sampling clock. Both these requirements are fulfilled in the laser Doppler velocimetry (LDV); this is because for a statistically relevant averaging a relatively large number of individual events is always necessary and the burst sequence is random. Consequently, sampling can be carried out up to frequencies close to the Nyquist limit or a lower sampling frequency is required than in conventional systems.

Figure 2:
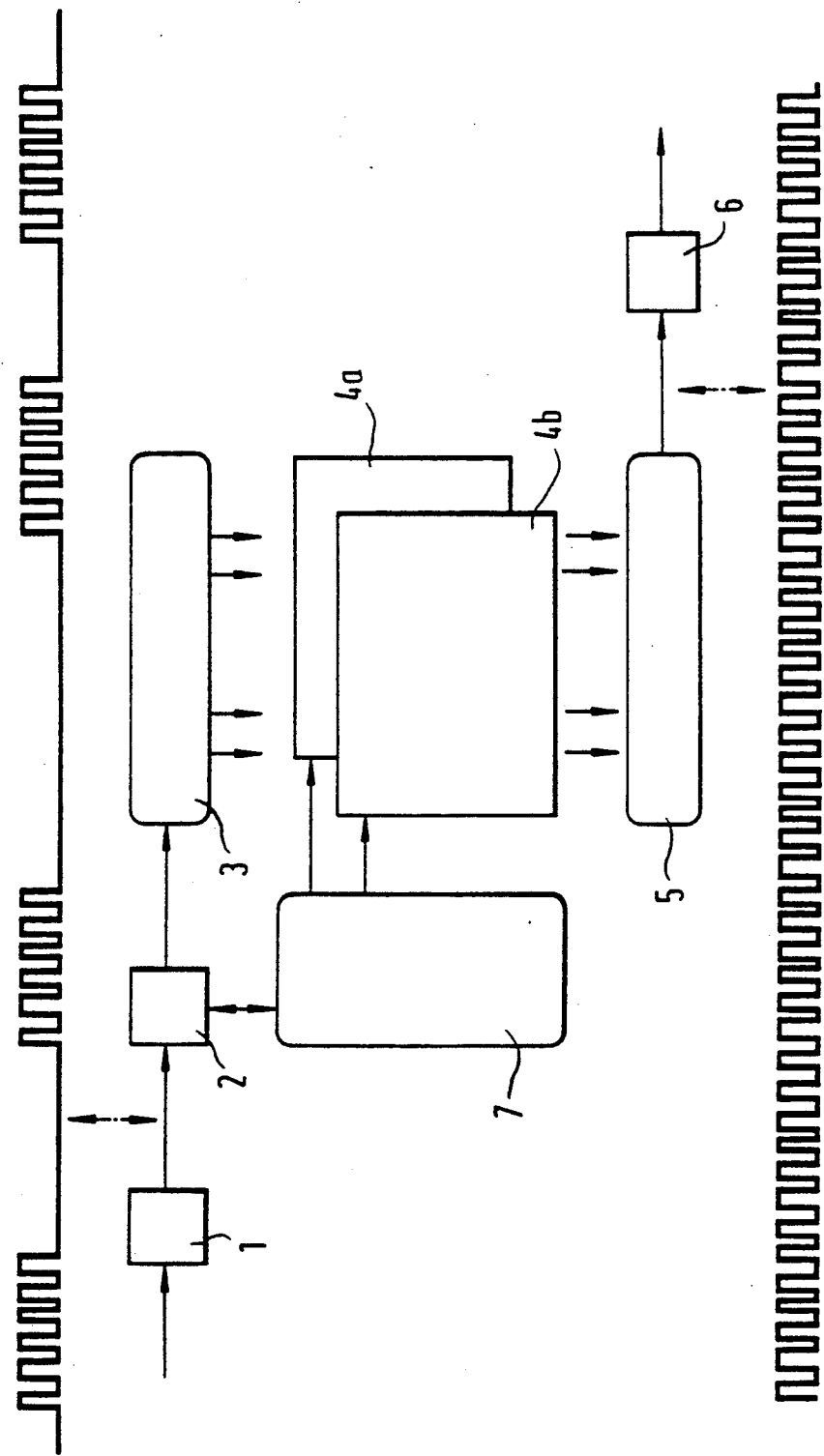
FIG. 2 shows a first embodiment of an apparatus according to the invention.

FIG. 2 shows an embodiment of an apparatus according to the invention and in the upper half of said FIG. 2 four separate signal bursts are shown, the different intervals of the bursts indicating that the individual bursts arrive statistically, i.e. independently of each other. As indicated by the upper dash-line double arrow in FIG. 2, the signal bursts are present in serial digital form. The signal bursts illustrated thus result from a corresponding conversion of an input signal which is not illustrated, i.e. a number of signal bursts, in a converter means 1.

The digitized signal bursts are supplied to a read-in means 2 and under the control of a control means 7 connected to the read-in means 2 supplied to a shift register 3.

The read-in means 2 may include a further means in which a signal analysis is carried out to enable for instance noise signals to be eliminated on the basis of criteria predefinable by the control means 7 so that only signal bursts which lie within the predetermined feature scope are passed on to the shift register 3.

For storing the signal bursts output by the shift register 3 two memories 4a, 4b are provided which alternate in the reading-in and out; each memory 4a, 4b serves both for reading in and for reading out. Whilst the first memory, for example the memory 4a, reads in new data (bursts) the second memory, for example the memory 4b, outputs its cyclically read-out sequence to the further evaluation. The serial reading out, now however in cyclic sequence, is carried out in a second shift register 5. In a unit 6 following the shift register 5 the further evaluation is then performed.

In the embodiment of the apparatus according to the invention illustrated in FIG. 3 this is shown again in more detail. The incoming digital signal is subjected to an evaluation and then passed to one of two memories.

Figure 3:
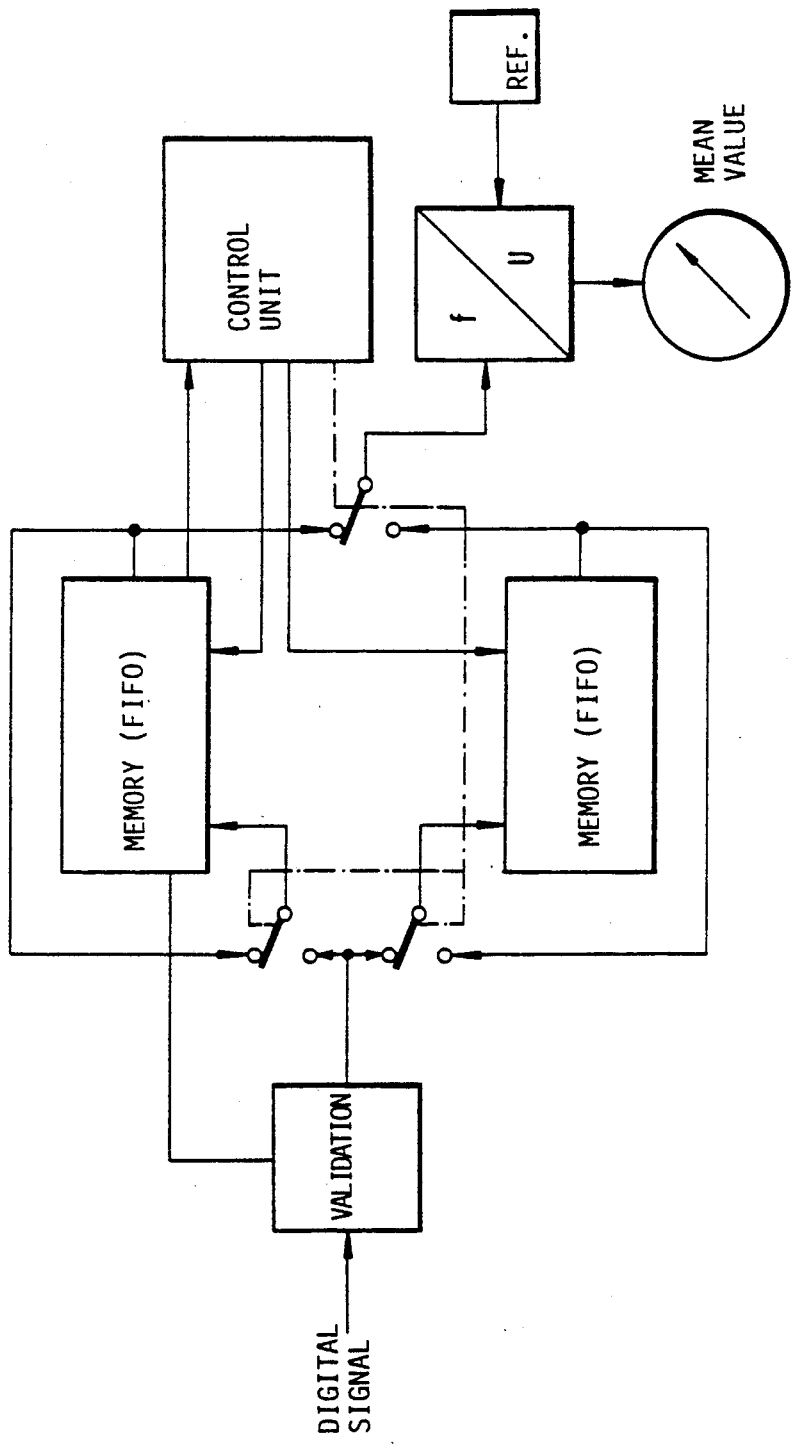
FIG. 3 shows a further embodiment of an apparatus according to the invention.

In the circuit arrangement illustrated in FIG. 3 the circuits are in a position such that the upper memory reads out cyclically and the lower memory takes on the incoming data. The two memories are necessary because the reading out of the memory cannot take place until all the n bursts are present and if only one memory were present the output would thus be interrupted in each read-in cycle. An analog frequency-voltage conversion as is indicated in FIG. 3 would then not function.

Thus, whilst the lower memory in FIG. 3 reads in new data the upper memory transfers its cyclically read-out bit sequence to the further evaluation. The switching over of the switches takes place synchronously with the read-out clock so that the following evaluation circuit always has a continuous data flow at its disposal.

The two storage means or memories according to FIGS. 2 or 3 may be technically implemented by so-called FIFOs each of 18 kbit storage capacity which can be so connected that they behave externally like normal shift registers. A control circuit effects the signal allocation to the individual circuit parts or the erasure of the read-in memory on arrival of a disturbed burst, which is detected by the rating circuit.

The further processing of the bit sequence read out of the upper or lower memory in FIG. 3 is carried out, as already described, by a frequency-voltage conversion and subsequent display of an average value of the thus resulting voltage which is therefore proportional to the frequency.

Figures 4A, 4B, 4C:
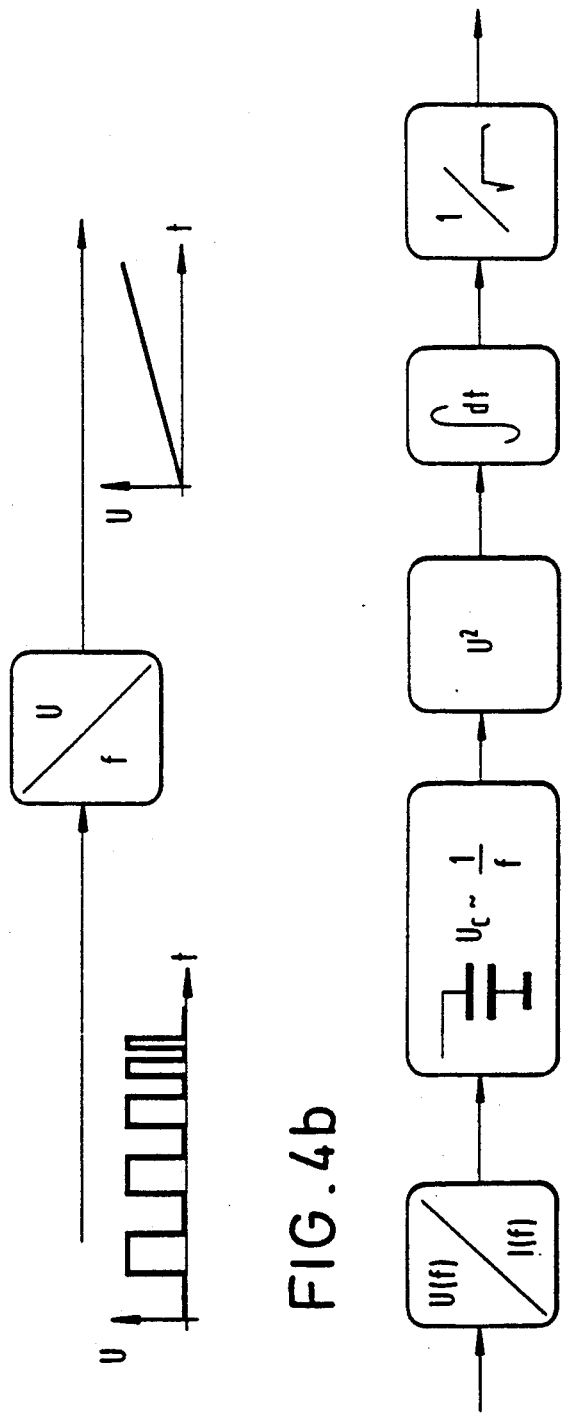
FIG. 4 shows a further embodiment of an apparatus according to the invention, FIG. 4a showing the desired mode of operation, FIG. 4b the actual configuration of the voltage-frequency conversion and FIG. 4c another voltage-frequency conversion.

FIG. 4a illustrates the desired conversion of a frequency signal which is present at the input of an apparatus according to the invention and which is to be converted to a voltage proportional to the frequency.

FIG. 4b indicates one possibility for the frequency-voltage conversion. The frequency signal present as voltage signal is converted to a current signal and impressed on a capacitor. The voltage tapped off the capacitor is inversely proportional to the frequency. The desired output signal is obtained by forming the root-mean-square value of the voltage, i.e. in particular by squaring, integrating or averaging, taking the square root and subsequently forming the reciprocal.

Although integrated circuits can be obtained to form the root-mean-square value and reciprocal value they have the disadvantage that only frequencies which are too low can be dealt with. With low dynamic requirements the voltage-frequency converter can simply be approximated by a resistance. This then leads to a simple RC network in the form of a low-pass filter. By interchanging the two elements for the arrangement as high-pass filter the following reciprocation can be dispensed with.

FIG. 4c shows one possibility for the technical implementation of the frequency-voltage conversion required for the desired frequencies. Firstly, an FM signal (frequency-modulated) is converted to a PPM signal (pulse-pause-modulated). Such a conversion can be carried out simply by a D-flip-flop, the FM signal controlling the clock input whilst the clear (or alternatively the preset) input is controlled by the system clock of the circuit. After the FM-PPM conversion a simple integration is made in an RC network in the form of a low-pass filter. Since the result after integration in the low-pass filter also depends on the height of the PPM pulses, the latter must be derived from a reference voltage, for instance via an additional highspeed switch.

If the embodiment of the invention described in FIG. 3 is not constructed as integrated circuit (ASIC) a relatively high cost expenditure results for the FIFOs and in addition the latter do not allow erasure of selective areas, for example the area with the last read-in burst. Thus, in the event of a disturbed burst each time the complete memory with all the previously read-in bursts must be cleared.

Figure 5:
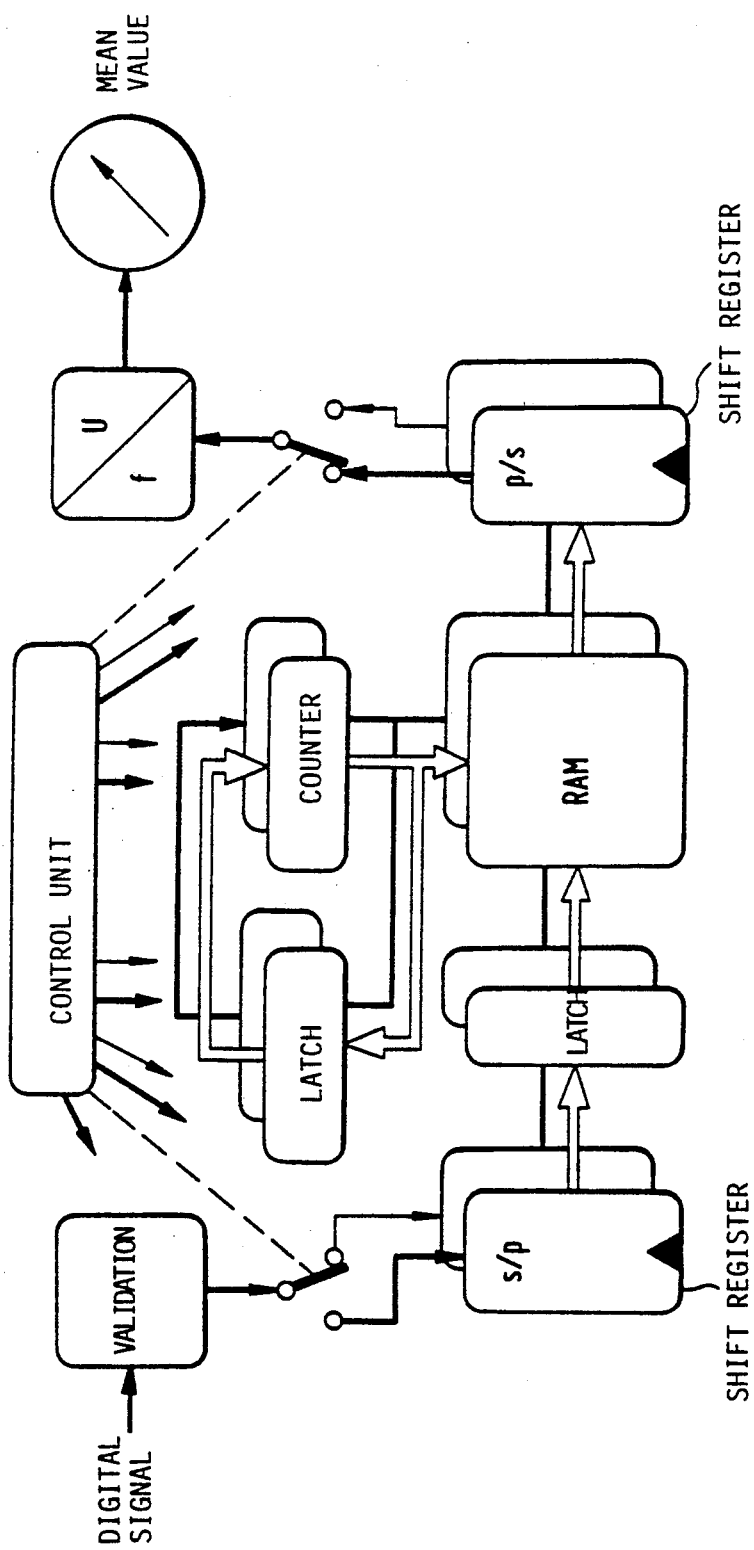
FIG. 5 shows a further embodiment of an apparatus according to the invention.

FIG. 5 explains an embodiment of the apparatus according to the invention in which such problems do not occur. In the circuit arrangement illustrated in FIG. 5 two parallel RAMs are provided. The circuit arrangement comprises two identical signal paths, each for alternating reading in and out. The serial sequence is led through a highspeed shift register of low length, for example 8 or 16 bits. The data are withdrawn from said shift register in parallel and supplied via a highspeed latch to a conventional parallel RAM. The address counter thereof may if required be charged with the aid of a latch to the value of the last burst or to another value, selective cancellation being possible. Output of the cyclically read-out values is via a shift register which is charged in parallel. The read-out clock rate need not be as fast as the read-in clock rate.

Instead of the one-bit digitizing used in the aforementioned examples of embodiment a digitizing with amplitude resolution (for example 4 bits) can be carried out, the individual bits being stored fundamentally in parallel signal paths, a dual signal path per bit, corresponding to the description described above. On reading out the signal can then be recomposed with true amplitude.

I claim:

1. A method for determining the frequency of short oscillation bursts of electrical signals comprising the steps of:
   reading a desired number of oscillation bursts into a storage means;
   reading the oscillation bursts out of the storage means in such a manner that the oscillation burst directly follow each other in the order of the reading into the storage means for generating an oscillation burst sequence;
   cyclically repeating a reading out of the oscillation burst sequence, the oscillation burst sequences being directly adjoined to each other until a previously predetermined number of readout cycles is reached; and
   processing the frequency of the oscillation burst sequences adjoined to each other.

2. A method according to claim 1, wherein the number of the oscillation bursts is one, wherein the one oscillation burst is cyclically read out and thereby one of the oscillation burst sequences is formed.

3. A method according to claim 1, wherein prior to reading in each oscillation burst a check of the oscillation burst for previously definable features takes place.

4. A method according to claim 1, wherein alternately a number of oscillation bursts is read in and a number of oscillation burst sequences read out.

5. A method according to claim 1, wherein each oscillation burst is digitized to a serial bit sequence prior to the reading in.

6. A method according to claim 1, wherein at least one of the reading in and reading out is carried out in a serial manner.

7. A method according to claim 1, wherein the determination of the frequency of the adjoining oscillation burst sequences is carried out in analog manner.

8. A method according to claim 7, wherein the frequency determination is made with an RC network.

9. An apparatus for determining the frequency of short oscillation bursts of electrical signals, comprising:
- a read-in means;
- a storage means operably connected to the read-in means;
- a control means operable connected to the storage means, wherein, in response to the control means, the oscillation bursts are read out from the storage means in cyclic repetition in succession and supplied to a processing unit which is connected to a memory means.

10. An apparatus according to claim 9, wherein the read-in means is preceded by a converter means which converts the oscillation bursts respectively into serial digital oscillation bursts.

11. An apparatus according to claim 10, wherein between the read-in means and memory means a shift register is provided.

12. Apparatus according to claim 10, wherein between the storage means and processing unit a shift register is provided.

13. An apparatus according to claim 9, wherein the processing unit is an analog processing unit.

14. An apparatus according to claim 13, wherein the analog processing unit is a lowpass filter.

15. An apparatus according to claim 9, wherein a means for checking the oscillation bursts for previously definable features precedes the read-in means.

16. An apparatus according to claim 9, wherein the storage means comprises a first store and a second store which alternately read in and out.

17. The use of a method according to any one of claims 1 to 8 for signal evaluation in laser Doppler velocimetry.

18. The use of an apparatus according to any one of claims 9 to 16 for signal evaluation in laser Doppler velocimetry.

* * * * *